United States Patent [19]

Bitar et al.

[11] Patent Number: 4,737,705

[45] Date of Patent: Apr. 12, 1988

[54] LINEAR POSITION SENSOR USING A COAXIAL RESONANT CAVITY

[75] Inventors: Ali Bitar, Peoria; Adam J. Gudat, Edelstein; Brian D. Huggins, Peoria; Wesley E. Jacobson, Peoria Heights; John F. Szentes, Peoria, all of Ill.

[73] Assignee: Caterpillar Inc., Peoria, Ill.

[21] Appl. No.: 927,214

[22] Filed: Nov. 5, 1986

[51] Int. Cl.[4] .............................................. G01N 22/00
[52] U.S. Cl. ........................... 324/58.5 C; 324/58.5 R
[58] Field of Search .................... 324/58.5 C, 58.5 B, 324/58.5 R, 58 C; 91/189 R; 92/5 R; 73/119 A

[56] References Cited

U.S. PATENT DOCUMENTS

| | | | |
|---|---|---|---|
| 3,589,177 | 6/1971 | Merlo | 324/58.5 C X |
| 4,365,503 | 12/1982 | Ho et al. | 324/58.5 C X |
| 4,588,953 | 5/1986 | Krage | 324/58.5 C |

Primary Examiner—Reinhard J. Eisenzopf
Assistant Examiner—Jack B. Harvey
Attorney, Agent, or Firm—Terry D. Morgan; Robert E. Muir

[57] ABSTRACT

Known linear position sensors suffer from inaccuracies owing to severe environmental conditions, such as temperature and humidity. Physical damage to sensors exposed to rugged work conditions is a limiting factor in the expected life of sensors used, for example, in the heavy equipment industry. A pair of loop antennas mounted internal to an extensible coaxial cavity respectively transmit and receive electromagnetic signals in the radio frequency range exciting a transverse electromagnetic field in the cavity when the frequency of the signal corresponds to the resonant frequency of the cavity. The resonant frequency of the cavity is primarily dependent upon the longitudinal length of the cavity. Therefore, a voltage controlled oscillator acts under the control of a sawtooth voltage waveform of a function generator to controllably deliver a variable frequency signal to the first loop antenna. An RF detector monitors the second loop antenna for an indication that the resonant frequency has been reached. At resonance a microprocessor samples the output of the VCO and correlates the resonant frequency to the length of the coaxial cavity. The sensor is particularly suited for use in the heavy equipment industry for detecting the extended length of hydraulic cylinders as it is highly insensitive to environmental conditions and protected from the work environment.

28 Claims, 4 Drawing Sheets

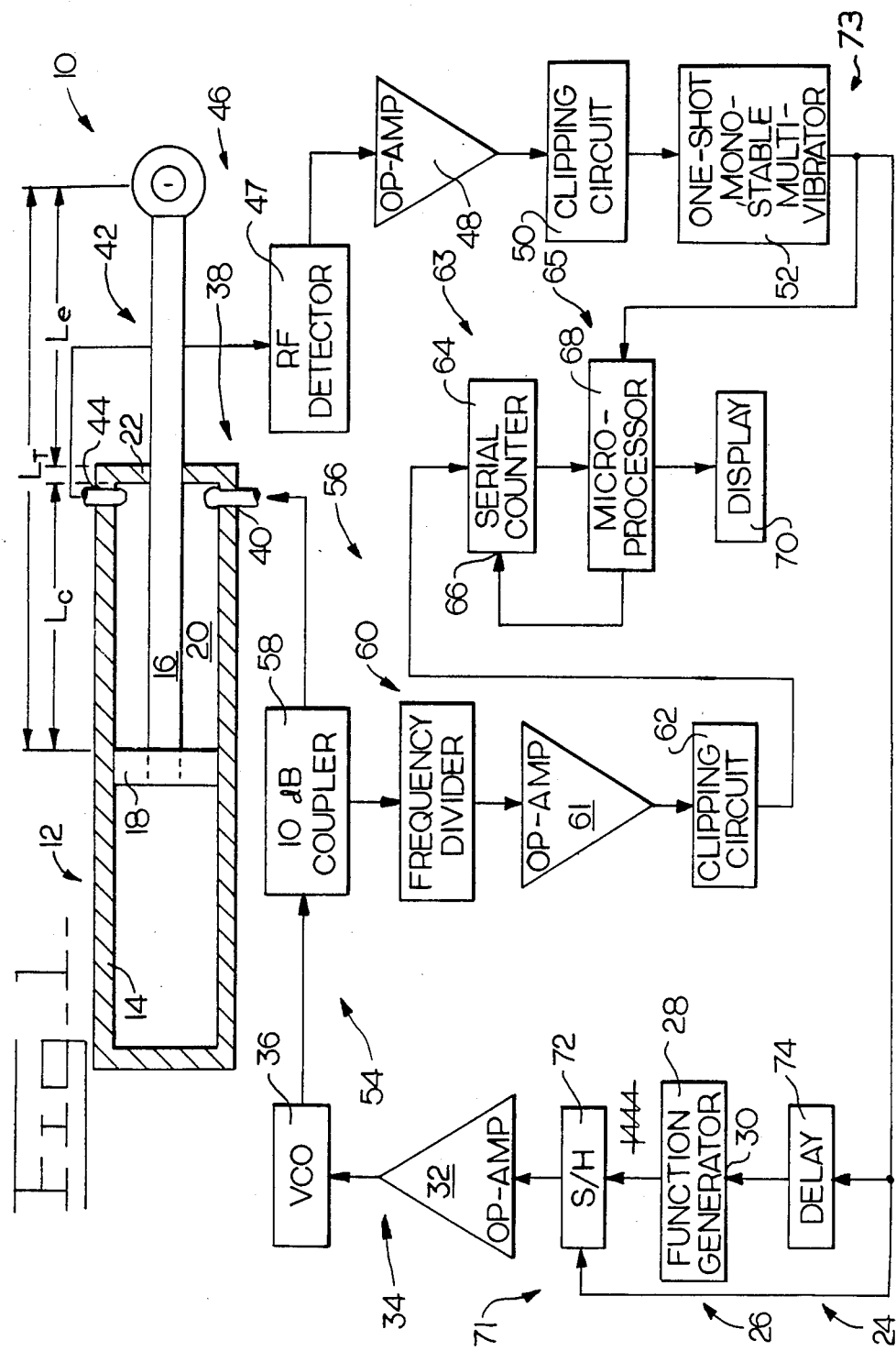

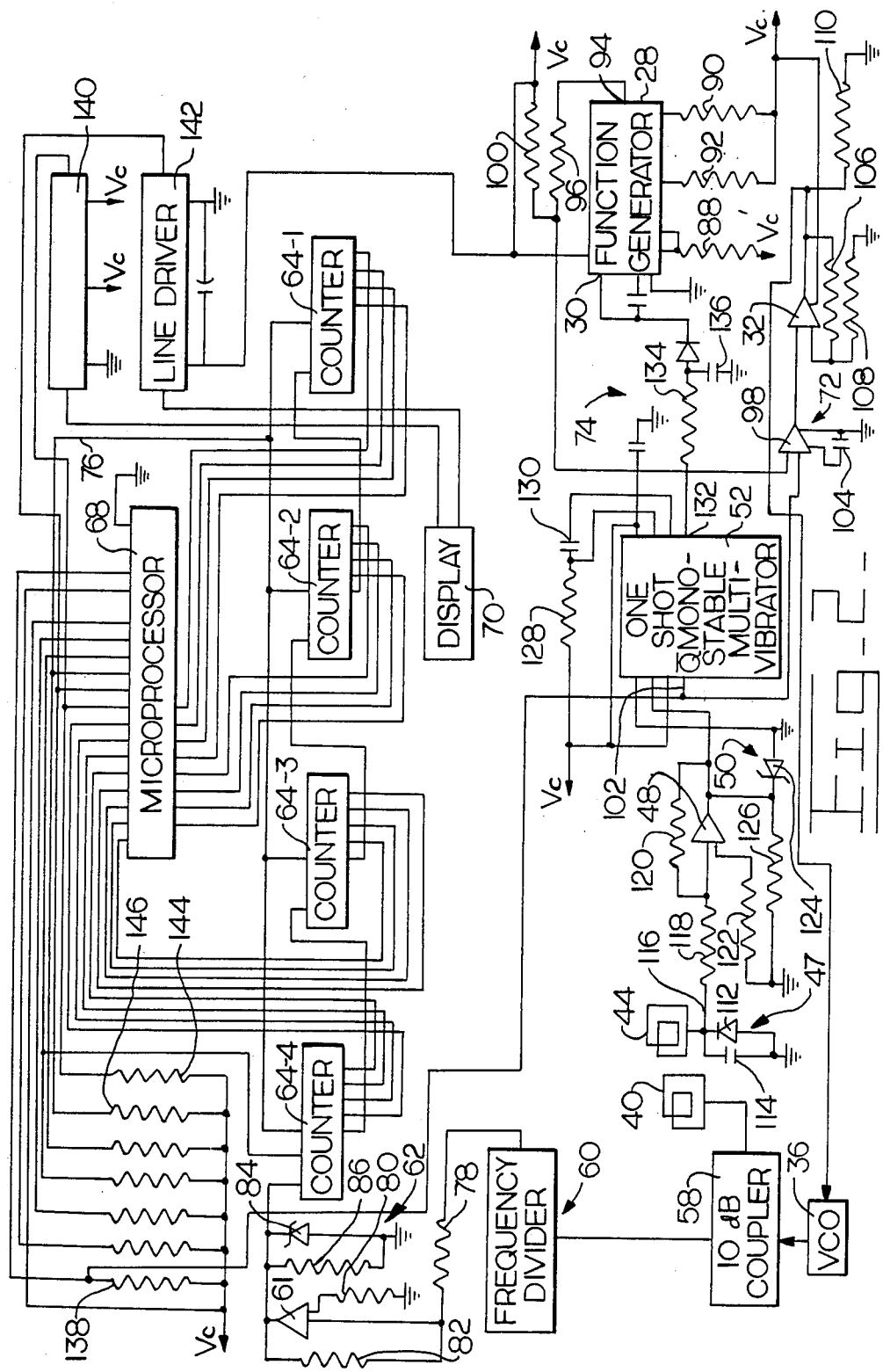

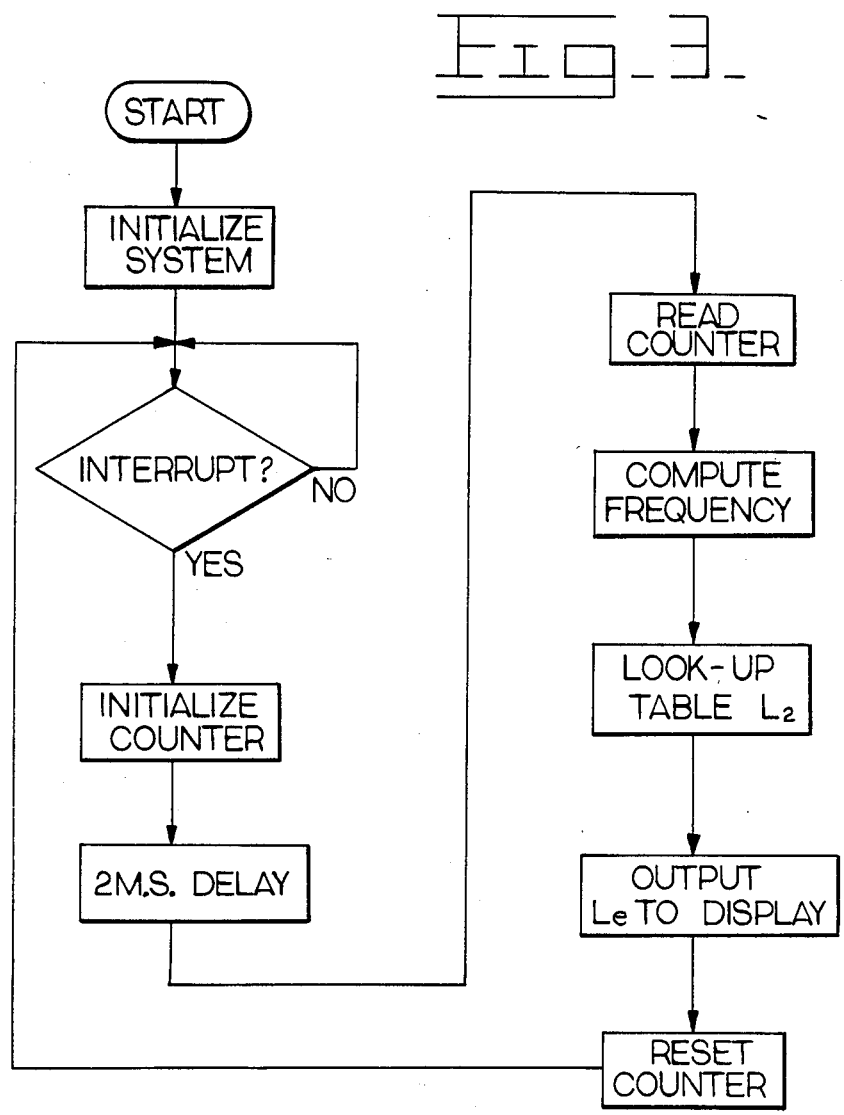

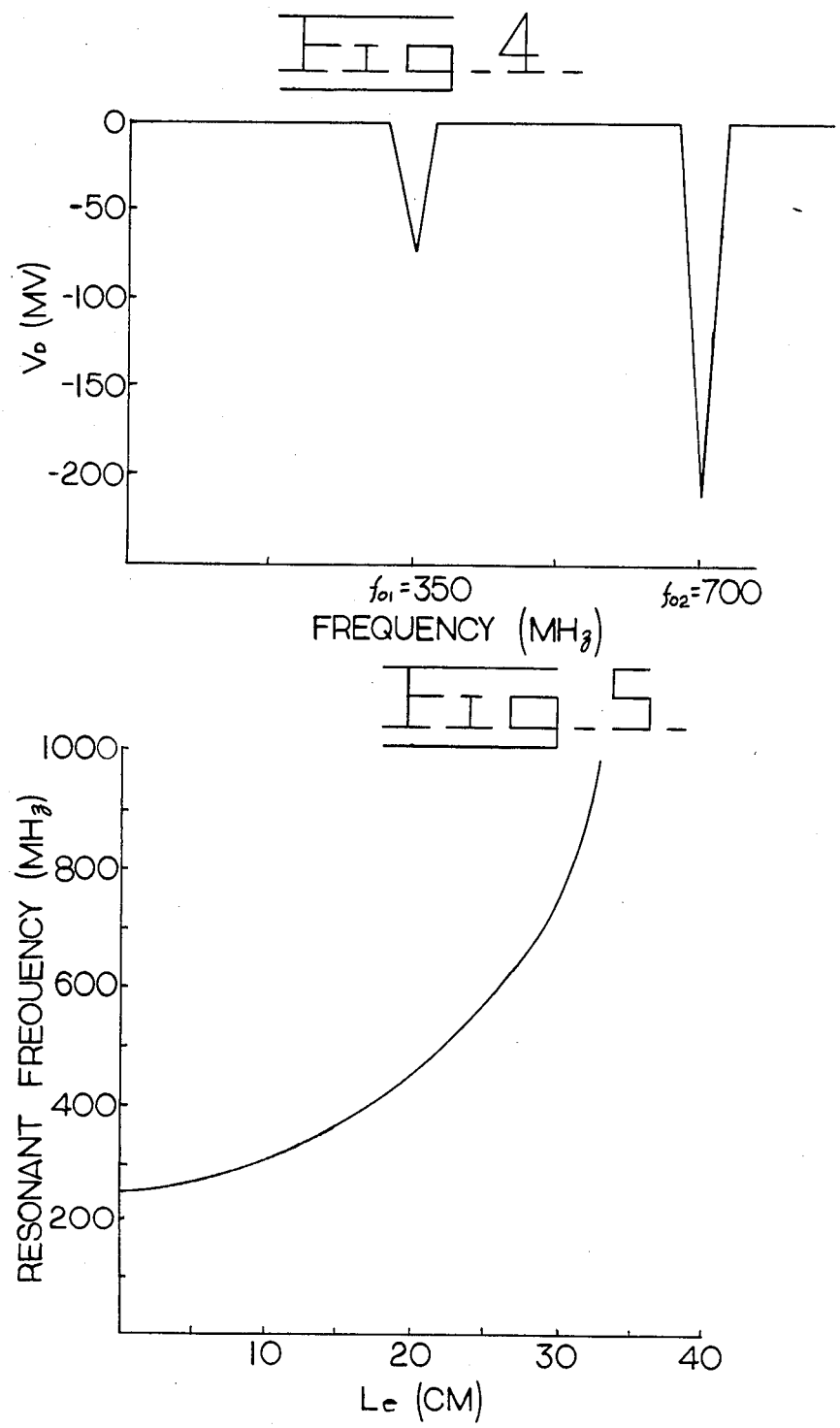

LINEAR POSITION SENSOR USING A COAXIAL RESONANT CAVITY

TECHNICAL FIELD

This invention relates generally to an apparatus for detecting linear position using electromagnetic radiation, and more particularly, to an apparatus for detecting linear position of a movable element by introducing a radio frequency (R.F.) signal into a coaxial resonant cavity.

BACKGROUND ART

In the field of hydraulic cylinders, a variety of systems have been proposed in which the displacement of the elements of the cylinder is electrically sensed and displayed or used to perform control functions. Conventional transducers have serious deficiencies owing in part to difficulties in mounting the units and the harsh environmental conditions to which they are exposed. Transducers used on hydraulic systems in the heavy equipment industry are particularly subject to damage from the severe work environment. Hydraulic cylinders are typically located in relatively unprotected areas and subjected to, for example, high g-forces, wide temperature variations, dust, water, debris, etc. which can result in both electrical and mechanical failure of the sensor.

Ideally, the transducer should be isolated from the work environment. One method for effecting such isolation is by mounting the transducer internal the cylinder, as illustrated in U.S. Pat. No. 3,726,191 issued to Johnston et al. Johnston employs a resistive strip positioned in the cylinder and fixed relative to the piston. A variable position tap is fixedly attached to the piston rod and slidably engagable with the resistive strip. While Johnston has developed a transducer which is less likely to be damaged by the work environment, a wear element has been introduced which has an accuracy that degrades over time and must be periodically replaced. Further, Johnston's sensor requires a customized hydraulic cylinder configuration and expensive retooling necessary to produce the new cylinder. Retrofitting existing hydraulic cylinders with the Johnston sensor is a difficult and costly operation.

The present invention is directed to overcoming one or more of the problems as set forth above.

DISCLOSURE OF THE INVENTION

In accordance with one aspect of the present invention, there is provided an apparatus which detects the linear position of a piston and a piston rod relative to a housing, wherein the piston and piston rod are movable within the housing and define a variable length coaxial resonant cavity. The apparatus includes means which determines the resonant frequency of the coaxial resonant cavity and delivers a signal having a frequency responsive to the resonant frequency, and means which receives the signal, determines the frequency of the received signal, and determines the linear position of the piston and piston rod relative to the housing in response to the determined frequency of the received signal.

In accordance with another aspect of the present invention, there is provided an apparatus which detects the linear position of a piston and a piston rod relative to a housing, wherein the piston and piston rod are movable within the housing and define a variable length coaxial resonant cavity. The apparatus includes means which delivers a first signal having a preselected magnitude continually varied between a minimum and maximum value, means which receives the first control signal and delivers a second signal of a preselected frequency in response to the magnitude of the first control signal, first coupling means which receives the second signal and delivers an electromagnetically radiated signal into the coaxial chamber, second coupling means which receives electromagnetic wave signals within the coaxial chamber and delivers a third signal, detector means which receives the third signal and delivers a fourth signal in response to the magnitude of the third signal exceeding a preselected setpoint, and processing means which receives at least a portion of the second signal, determines the instantaneous frequency of the second signal, calculates the position of the piston and piston rod relative to the housing, and delivers a control signal in response to receiving the fourth signal.

In accordance with another aspect of the present invention, there is provided an apparatus which detects the linear position of a piston and a piston rod relative to a housing, wherein the piston and piston rod are movable within the housing and define a variable length coaxial resonant cavity. The apparatus includes means which delivers a first signal having a preselected magnitude continually varied between a minimum and maximum value, means which receives the first control signal and delivers a second signal of a preselected frequency in response to the magnitude of the first control signal, first coupling means which receives the second signal and delivers an electromagnetically radiated signal into the coaxial chamber, second coupling means which receives electromagnetic wave signals within the coaxial chamber and delivers a third signal, detector means which receives the third signal and delivers a fourth signal in response to the magnitude of the third signal attaining a peak value, and processing means which receives at least a portion of the second signal, determines the instantaneous frequency of the second signal, calculates the position of the piston and piston rod relative to the housing, and delivers a control signal in response to receiving the fourth signal.

Displacement indicating apparatus used on hydraulic cylinders have heretofore required either extensive modification to the cylinder or cumbersome and easily damaged add on devices. The instant apparatus employs known properties of coaxial resonant cavities to use the internal structure of the cylinder as the medium for extracting information on the relative extension of the piston rod. Rather than add a conventional or custom sensor, the cylinder becomes the sensor and simply requires that the cavity be excited by an appropriate R.F. signal and monitored for useful information. Modifications to the hydraulic cylinder, as well as the addition of sensors, are eliminated in the instant apparatus.

BRIEF DESCRIPTION OF THE DRAWINGS

FIG. 1 illustrates a block diagram of the present invention;

FIG. 2 illustrates an electrical schematic of an electronic circuit employed in an embodiment of the present invention;

FIG. 3 illustrates a flowchart of one embodiment of the software used in the present invention;

FIG. 4 illustrates a graphical representation of the detected R.F. signal versus the frequency of the input R.F. signal; and FIG. 5 illustrates a graphical representation of the displacement of the cylinder rod versus the frequency of the input R.F. signal.

BEST MODE FOR CARRYING OUT THE INVENTION

Referring now to the drawings, wherein a preferred embodiment of the present apparatus 10 is shown, FIG. 1 illustrates a stylized representation of a conventional hydraulic cylinder 12 formed from a housing 14, piston rod 16, and piston 18. The rod 16 has a total length $L_t$ and is movable within the housing 14 to form a variable length coaxial resonant cavity 20. The cavity length $L_c$ is equivalent to the total length $L_t$ minus the length $L_e$ of the extended portion of the rod 16 plus the thickness of the housing end wall 22. Thus, by determining the cavity length $L_c$, the extended length $L_e$ can be directly derived and used as an indicator of the actual position of a work implement attached to the piston rod 16. The apparatus 10 detects the position of piston 18 and piston rod 16 relative to the housing 14 for the purpose of either directly displaying the detected position or for use in a system which seeks to control the position of, for example, a work implement of a construction vehicle.

The coaxial resonant cavity 20 appears fundamentally similar to a coaxial transmission line with shorted ends. When excited by a radio frequency signal, the cavity 20 is a highly reactive load except at resonant frequencies. More specifically, if the length $L_c$ of the cavity 20 is an integer multiple of half the wavelength of the signal delivered into the coaxial cavity, then some R.F. energy is coupled into the cavity 20 exciting a TEM (transverse electromagnetic) field which can be described as the superposition of two waves propagating along the coaxial cavity 20. The presence of this time varying electromagnetic field in the cavity causes the receiving antenna 44 to detect a signal of the same frequency. The resonant frequency of an ideal coaxial cavity is given by the equation:

$$f_{res} = \frac{n}{2}\left(\frac{c}{\sqrt{E_r}} * \frac{1}{L_c}\right)$$
$$(n = 1,2,3 \ldots)$$

where, $c = 3 \times 10^{10}$ cm/s, f is the excitation frequency, and $E_r$ is the relative permittivity of the fluid within the cavity. The resonant frequency of the coaxial cavity 20 of the hydraulic cylinder 12 differs from that of the ideal equation owing to deviations in the geometry of the cavity 20 and from the effect of the actual coupling structure. However, a one to one relationship exists between the actual resonant frequency of the cavity 20 and the length of the cylinder $L_c$ such that deviations from the ideal cavity may be accounted for by calibrating each hydraulic cylinder 12 family type.

A means 24 determines the resonant frequency of the coaxial cavity 20 and delivers a signal which has a frequency responsive to the resonant frequency. The means 24 includes a means 26 which delivers a first signal having a preselected magnitude varying between preselected minimum and maximum values. A function generator 28 of the type commercially available from Exar as part number XR2207 is included in the means 26 and acts to deliver a time varying voltage continuously ramping between a selectable minimum and maximum value (as is graphically illustrated in FIG. 1). The function generator 28 includes an input port 30 which resets the output of the function generator to the minimum value in response to receiving a positive transition control signal.

An operational amplifier 32 receives the voltage output of the function generator 28 and delivers an amplified output to a means 34 which receives the first control signal and delivers a second signal of a preselected frequency in response to the magnitude of the first control signal. The means 34 includes a voltage controlled oscillator (VCO) 36 which delivers a signal that has a frequency content linearly ramped between a minimum and maximum value directly proportional to the ramped voltage signal of the function generator 28. The minimum frequency required from the VCO 36 is determined by the maximum $L_c$ expected for a given cylinder. Conversely, the maximum frequency required from the VCO 36 is determined by the minimum $L_c$ expected for a given cylinder. However, the maximum frequency can be larger than the cutoff frequency of the next mode to propagate which, if it is excited, will give spurious results. If the maximum frequency is above the cutoff frequency of the next propagating mode, the coupling antenna can be positioned to eliminate the effect of the next propagating mode. For example, the hydraulic cylinder manufactured by Caterpillar Inc. as part number 8J6257 has a maximum cutoff frequency $f_{max}$ of 1.1 GHz.

A first coupling means 38 receives the second signal and delivers an electromagnetically radiated signal into the coaxial cavity 20. The first coupling means 38 includes a loop antenna 40 positioned so as to couple the R.F. signal into the coaxial cavity 20 adjacent the end wall 22. A second coupling means 42 receives the electromagnetic wave signals within the cavity 20 and delivers a third signal in response to receiving the electromagnetic wave signals. The second means 42 also includes a loop antenna 44 positioned through and fixedly connected to the end wall 22 so as to receive the resonant frequency signal radiated by the first coupling means 38. As discussed previously, the loop antenna 44 will receive R.F. power only at resonant frequencies. Thus, the third signal will only be delivered at resonance. Alternatively, rather than employ the second antenna 44, a directional coupler or a reflectometer bridge such as part number HP11666A manufactured by Hewlett Packard can be disposed intermediate the VCO 36 and the first antenna 40. The reflectometer bridge would deliver the R.F. signal reflected by the cavity 20 which would have minimal R.F. power content at resonant frequencies. Monitoring the reflected signal would also yield information pertaining to the cavity length $L_c$.

A detector means 46 receives the third signal from the second antenna 44 and delivers a fourth signal in response to the magnitude of the third signal exceeding a preselected setpoint. The means 46 includes an R.F. detector 47 of conventional design which generates a negative voltage responsive to the received R.F. power. An operational amplifier 48 inverts and amplifies the negative voltage signal generated by the R.F. detector and delivers a signal to a clipping circuit 50. The clipping circuit 50 converts the analog signal to a square wave digital pulse in response to the analog signal attaining a preselected voltage. The digital pulse triggers a one-shot monostable multivibrator 52 which delivers the fourth signal as a positive going pulse for a preselected duration of time indicating that the VCO 36 has reached the resonant frequency of the cavity 20.

At this time, it is desirable to determine the frequency of the signal delivered by the VCO 36, as the resonant frequency has been shown to be proportional to the cavity length $L_c$. A means 54 receives the frequency signal from the means 34, determines the frequency of the received signal, and determines the position of the piston 18 and piston rod 16 relative to the housing 14 in response to the determined frequency of the received frequency signal. The receiving means 54 includes a processing means 56 which receives at least a portion of the second signal, determines the frequency of the received second signal in response to receiving the fourth signal, and determines the position of the piston 18 and piston rod 16 relative to the housing 14 in response to the frequency of the second signal. A 10 dB coupler 58 is connected intermediate the VCO 36 and the first loop antenna 40 and acts to deliver 90%- of the R.F. power of the VCO 36 to the loop antenna 40 and the remaining 10% to the processing means 56. Owing to inherent losses in the db coupler 58, actual power distribution is slightly altered from the ideal condition described herein, but has little effect on the overall operation of the apparatus 10. The processor means 56 includes a means 60 which frequency divides the signal from the R.F. range into a much lower frequency range which can be more effectively analyzed by the relatively slow operation of digital electronics. Included within the frequency divider means 60 is an operational amplifier 61 which inverts and amplifies the frequency divided signal and delivers a signal to a clipping circuit 62. The clipping circuit 62 converts the analog signal to a square wave digital pulse and delivers the pulse train to a means 63. The means 63 receives the frequency divided signal, counts the number of cycles occurring within a preselected duration of time in response to receiving a control signal, and delivers a count signal having a magnitude responsive to the count. The means 63 includes a conventional serial counter 64 such as part number 74LS191 manufactured by Motorola Corp. A clock input 66 of the counter 64 activates the counter 64 to begin accumulating a total number of pulses received during a preselected duration of time. Maintaining the sample period constant will result in a total count which is directly proportional to the frequency content of the signal. A microprocessor means 65 delivers a control signal to the clock input 66 of the counting means 63 in response to receiving the fourth signal, receives the count signal, and determines the position of the piston 18 and piston rod 16 relative to the housing 14 in response to the magnitude of the count signal. The microprocessor means 65 includes a commercially available microprocessor 68 from the Motorola Corp. as part number 68701 which responds under software control to the pulse from the one-shot 52 to deliver a control signal to the clock input 66. At the end of the sample period the microprocessor 68 receives the accumulated count and uses the total count to reference a look-up table similar to that graphically shown in FIG. 5. The graph of FIG. 5 illustrates the proportional relationship between the resonant frequency of the cavity 20 and the extended length $L_e$ of the piston rod 16. In the illustrated embodiment, the microprocessor 68 delivers a signal to a display 70 such as a grouping of 7-segment displays and represents the extended length $L_e$ retrieved from the look-up table. The counter 64 is reset to zero by the microprocessor 68 in preparation of the next iteration.

To ensure that an accurate count of the frequency output of the VCO 36 is obtained, a means 71 holds the magnitude of the first signal at a preselected value in response to receiving the fourth signal from the one-shot 52. The magnitude of the voltage of the first signal is maintained at the present level for the duration of the one-shot 52 pulse by a conventional sample and hold (S/H) circuit 72 disposed between the function generator 28 and operational amplifier 32. Means 73 resets the first signal generating means 26 to the minimum value in response to receiving the fourth signal. The means 73 includes the one-shot 52 and a delay 74. The output pulse of the one-shot 52 is delivered through the delay 74 to the reset input port 30 of the function generator 28 such that, at the end of the one-shot pulse plus the delay 74, the function generator is reset to the minimum value. Resetting the output of the function generator 28 prevents the VCO 36 from reaching an integer multiple frequency of the fundamental frequency as shown in FIG. 4. If the VCO 36 was allowed to reach the second resonant frequency $f_{02}$, the detector means 46 would deliver the fourth signal indicating that the resonant frequency had been reached. The resultant determination of the frequency would lead to the cavity length $L_c$ being calculated as significantly less than the actual length. Similar errors of greater magnitude would occur at each integer multiple of the fundamental resonant frequency. Resetting the function generator 28 to the minimum value in response to detecting the fundamental resonant frequency ensures looking only at the first harmonic of the resonant frequency.

An alternative embodiment contemplates replacing the detector means 46 with a means (not shown) which receives the third signal and delivers the fourth signal in response to the magnitude of the third signal attaining a peak value rather than the third signal exceeding a preselected setpoint. The remainder of the apparatus 10 will continue to operate as previously described except that the fourth signal will be delivered to indicate resonance at the peak level of the third signal. This embodiment will prevent accuracy degradation. For example, the waveform of FIG. 4 shows the R.F. detector output trace with a fundamental resonant frequency occurring at 350 MHz. However, only the peak of the signal occurs at 350 MHz. Selection of the preselected setpoint below −50 mV will result in detecting a resonant condition at slightly less than the actual resonant frequency. Variations in the geometric configuration of different cylinders cause variations in the magnitude and width of the resonant spike, forcing the setpoint to be selected at a compromise value which will work for all possible cylinders. By using a conventional peak level detector, the apparatus 10 is assured of detecting the actual resonant frequency.

Referring now to FIG. 2, an electrical schematic of an embodiment of the apparatus 10 is shown. The microprocessor 68 has a plurality of input lines connected to the outputs of a group of four four-bit serial counters 64-1, 64-2, 64-3, 64-4. Each of the serial counters has a carry out bit connected to the carry in bit of the next subsequent counter, such that a maximum count of 65,535 can be attained and transferred to the microprocessor 68 via the sixteen bit parallel input port. The outputs of the serial counter 64-4 form the least significant four bits of the parallel output port. Further, the carry in port of the serial counter 64-4 receives the resonant frequency divided signal from the means 60 through the op amp 61 and clipping circuit 62 and begins to accumulate a count of the frequency divided signal in response to receiving an enabling signal from the microprocessor via line 76. The op amp 61 includes a resistor 78 connected intermediate the means 60 and non-inverting input of the op amp 61, a resistor 80 connected between system ground and the inverting input of the op amp 61, and a feedback resistor 82 connected between the output and the non-inverting input of the op amp 61. The clipping circuit 61 is formed from a zener diode 84 and resistor 86 connected in parallel between system ground and the output of the op amp 61. The zener diode 84 is selected to have a break down voltage which does not exceed the allowable input voltage of the counter 64-4. The zener diode 84 clamps the output voltage of the op amp 61 to the break down voltage and generate a digital pulse train for the counter 64-4.

The frequency divider means 60 receives a signal in the radio frequency range from the 10 dB coupler 58. The 10 dB coupler receives a frequency signal from the voltage controlled oscillator 36 and delivers at least a portion of the signal to the loop antenna 40.

The function generator 28 has three resistors 88,90,92 interconnecting system voltage $V_c$ to a group of input ports. The resistors 88,90,92 are connected in such a manner and have ohmic values selected such that a sawtooth voltage waveform is generated and delivered at an output 94 of the function generator 28. In the illustrated embodiment, the voltage ramps between a minimum value of $-2$ V and a maximum value of $+2$V at a frequency of 833 Hz. These values have been selected for the particular cylinder geometry and type of VCO discussed herein. Any variations in these parameters will result in corresponding alterations to the frequency and range of the VCO signal. The output 94 is connected through a resistor 96 to the non-inverting input of an op amp 98 of the sample and hold circuit 72. System voltage $V_c$ is also connected through a pull up resistor 100 to the non-inverting input of the op amp 98. The inverting input of the op amp 98 is connected to the "NOT Q" output 102 of the monostable multivibrator 52 so that a low signal from the multivibrator 52 will cause the op amp 98 to store a charge on a capacitor 104 equivalent to the voltage level present on the non-inverting input. The output of the op amp 98 is connected to the op amp 32 which has two resistors 106,108 connected to implement a non-inverting amplifier with a gain of approximately nine. The output of the op amp 32 is connected through a resistor 110 to system ground and to a control input of the voltage controlled oscillator 36. The oscillator 36 will respond to the magnitude of voltage at the control input and deliver a signal having a frequency directly proportional to the magnitude of the voltage. For example, in the illustrated embodiment, the control input voltage can preferably assume a value in the range of $+2$ V to $+24$ V, resulting in the frequency output of the VCO 36 being a proportional value in the range 50 MHz to 1.5 GHz.

The frequency output of the VCO 36 is delivered to the 10 dB coupler which splits the signal and delivers $+10$ dB of the input signal power to the frequency divider means 60 and the remainder of the signal is delivered to the first loop antenna 40.

The second loop antenna 44 is connected to the R.F. detector 47 which includes a parallel arrangement of a diode 112 and a capacitor 114 connected between a supply line 116 and system ground. The anode of the diode 112 is connected to system ground, thereby impressing a negative voltage on the line 116 in response to receiving a radio frequency signal. The op amp 48 is connected to the line 116 and has a group of three resistors 118,120,122 connected to implement a non-inverting amplifier with a gain of approximately 4.7. The output of the op amp 48 is connected to the clipping circuit 50 formed by a zener diode 124 connected in parallel with a resistor 126 between the output and system ground. A trigger input of the monostable multivibrator 52 is also connected to the output of the op amp 48 which will cause a "low" signal to be delivered at the "NOT Q" output 102 for a duration of time determined by the values of a resistor 128 and capacitor 130. In the prefered embodiment, the time duration is selected to be approximately 6 msec. Conversely, the multivibrator 52 has a "Q" output 132 which has a value directly opposite to the "NOT Q" output and is delivered through the delay 74 to the reset input port 30 of the function generator 28. The delay 74 includes a resistor 134 connected in series between the "Q" output 132 and the reset input port 30, and a capacitor 136 interconnecting system ground and the reset input port 30. The resistor 134 and capacitor 136 are selected to have values which will generate a delay of 100 usec and reset the output of the function generator to the minimum value at the end of the delay period. In addition to controlling the sample and hold circuit 72, the "NOT Q" output 102 is also connected to an interrupt input port of the microprocessor 68 and to system voltage $V_c$ through a pull up resistor 138. A "low" output at the "NOT Q" port 102 connects the pull up resistor 138 to system ground and delivers a "low" signal to the microprocessor 68 which indicates that a resonant frequency has been reached. Further, the S/H circuit 72 has latched the control voltage delivered to the VCO 36 to the output voltage of the function generator when the resonant condition is detected. The VCO 36 is consequently held at the resonant frequency until the S/H 72 is reset by the termination of the pulse from the multivibrator 52. The delay circuit 74 is included to insure a minimum sample period and proper initialization for the S/H 72.

The display 70 is connected to the microprocessor 68 through a pair of line drivers 140,142 and pull up resistors 144,146. The line drivers 140,142 act to convert the voltage levels between that of the microprocessor 68 and display 70. The extended length $L_e$ of the cylinder 12 is serially transmitted from the microprocessor 68 through the line driver 140 to the display 70. The display 70 responds by delivering a signal to the microprocessor 68 through the line driver 142 indicating that the information has been received in a handshaking type arrangement. Those skilled in the art of electronic design will readily recognize that the extended length information can be used in a closed loop feedback control as well as passively displaying the information.

FIG. 3 illustrates one embodiment of a flowchart representation of a software program used by the microprocessor 68 to effect control of the counter 64 and display 70. The software routine begins at start-up by initializing all the variables to preselected known values. Thereafter, the control software simply loops back upon itself continually quering for an interrupt. In the illustrated embodiment, the software is an interrupt based system where the control interrupt is generated by the "NOT Q" output 102 of the one shot 52.

At resonant frequency, the one shot 52 generates an interrupt signal and software control is subsequently transferred to initialize the counter 64. A signal is delivered via line 76 which causes the counter 64 to begin accumulating a total count of the number of pulses received during a 2 ms delay. At the end of the time delay, the total count present on the output ports of the counters 64-1,64-2,64-3,64-4 is read by the microprocessor 68 and converted to an approximation of the resonant frequency by a direct linear relationship. The total count is directly proportional to the frequency output of the VCO 36.

A look-up table, which contains the information shown in the graph of FIG. 5, is programmed into the memory of the microprocessor. The software routine accesses the look-up table and uses the computed frequency to determine the extended length $L_e$ of the cylinder rod 16. For example, a calculated frequency of 275 MHz indicates an extended length $L_e$ of 5 cm. The values shown in the graph of FIG. 5 are peculiar to the hydraulic cylinder used herein. Similar graphs exist for each type of cylinder and should be programmed into the memory according to the cylinder on which the apparatus 10 is to be used.

The extended length $L_e$ is subsequently delivered to the display 70 and the counter 64 reset to an initial value of zero. Control returns to the interrupt query loop and waits for the VCO 36 to reach the resonant frequency of the coaxial chamber 20 and generate a control interrupt. The process then repeats at intervals of approximately 10 msec.

Industrial Applicability

In the overall operation of the apparatus 10, assume that the piston rod 14 of the hydraulic cylinder 12 is connected to a work implement of a heavy equipment vehicle, such as the blade of a bulldozer. A control system seeks to maintain the height of the bulldozer blade at an optimum position to maximize the work performed by the bulldozer. The use of modern control theory allows the control to monitor various operating parameters and apply a properly weighted PID equation to continuously adjust the height of the blade and effect optimal control. Proper feedback of the height of the blade is necessary to govern the blade position in a stable manner. The position feedback must necessarily be of a relatively high accuracy and is provided by the apparatus 10 monitoring the cylinder 12 position.

Operation of the apparatus 10 is based upon the unusual similarities exhibited between the coaxial cavity 20 of the cylinder 12 and a coaxial cable. Both devices support transverse electromagnetic waves, and the cavity 20 accepts maximum F.R. power at resonant frequencies. The resonant frequency of the cavity 20 is primarily dependent upon the length of the cavity $L_c$. From this principle, one recognizes that by determining the resonant frequency of the cavity 20, the length of the cavity $L_c$ can be derived and hence, the position of the work implement is directly proportional to the resonant frequency.

Determining the resonant frequency involves sweeping through a range of frequencies which include all possible fundamental resonant frequencies for the particular cylinder 12 being monitored. This range of frequencies is delivered directly into the cavity 20 by an antenna 40. Any of several conditions can be monitored as an indication of resonance. First, a second antenna can be disposed within the cavity which will deliver a signal of maximum power at resonant frequencies. Monitoring the power output by the second antenna 44 for a signal of peak magnitude or of a preselected magnitude will reveal when the cavity 20 is in resonance. An alternate embodiment does not employ the second antenna 44, but monitors either the R.F. power transmitted to the first antenna 40 or the R.F. power reflected by the cavity 20. Transmitted power attains a maximum value at resonance; conversely, reflected power attains a minimum value at resonance. Peak or level detectors similar to those already described can be used in the alternate embodiment to provide a signal indicative of resonance.

Irrespective of the manner in which resonance is detected, the signal used to indicate resonance halts the sweeping of the frequency and holds the frequency content of the signal at or near the resonant frequency. Time delays associated with generating the resonance indicating signal allow the frequency of the swept signal to progress by a fixed magnitude beyond the actual resonant frequency. However, the time delays are known and constant, thus, a one to one relationship exists between the detected frequency and the cavity length $L_c$.

A microprocessor 68 operates under software control to enable a counter 64 for a fixed duration of time to count the number of cycles of the swept frequency signal. The counter 64 operates during the time period which the frequency content of the signal is held at a constant value. At the end of the sample period, the counter 64 has accumulated a value proportional to the fixed frequency of the R.F. signal which can be used to access a look-up table stored in memory to derive a precise indication of the extended length $L_e$ of the cylinder 12. A preselected time delay after the resonance signal is delivered, the R.F. signal is returned to the minimum frequency value and allowed to begin sweeping toward the maximum frequency value causing the entire process to begin anew.

Other aspects, objects, and advantages of this invention can be obtained from a study of the drawings, the disclosure, and the appended claims.

We claim:

1. An apparatus for detecting linear position of a piston and a piston rod relative to a housing, said piston and piston rod being movable within said housing and defining a variable length coaxial resonant cavity, comprising: means for delivering a first signal having a preselected magnitude varying between preselected minimum and maximum values;

means for receiving said first signal and delivering a second signal of a preselected frequency in response to the magnitude of said first signal;

first coupling means for receiving said second signal and delivering an electromagnetically radiated signal into said coaxial cavity;

second coupling means for receiving electromagnetic wave signals within said coaxial cavity and delivering a third signal in response to receiving said electromagnetic wave signals;

detector means for receiving said third signal and delivering a fourth signal in response to the magnitude of said third signal exceeding a preselected setpoint;

means for resetting said first signal delivering means to said minimum value in response to receiving said fourth signal; and means for receiving said second signal, determining the frequency of said second signal, and determining the linear position of said piston and piston rod relative to said housing in response to the determined frequency of said received signal.

2. An apparatus, as set forth in claim 1, wherein said first coupling means includes processing means for receiving at least a portion of said second signal, determining the frequency of said received second signal in response to receiving said fourth signal, and determining the linear position of said piston in response to the frequency of said second signal.

3. An apparatus, as set forth in claim 1, including means for holding the magnitude of said first signal at a preselected value in response to receiving said fourth signal.

4. An apparatus, as set forth in claim 1, wherein said fourth signal is delivered to said first signal delivering means after a preselected time delay.

5. An apparatus, as set forth in claim 2, wherein said processing means includes means for receiving at least a portion of said second signal and delivering a frequency divided signal;
   means for receiving said frequency divided signal, counting the number of cycles occurring within a preselected duration of time in response to receiving a control signal, and delivering a count signal having a magnitude responsive to the count; and
   microprocessor means for delivering a control signal to said counting means in response to receiving said fourth signal, receiving said count signal, determining the linear position of said piston and piston rod relative to said housing in response to the magnitude of said count signal.

6. An apparatus, as set forth in claim 1, wherein said first coupling means includes a loop antenna.

7. An apparatus, as set forth in claim 1, wherein said second coupling means includes a loop antenna and a radio frequency signal detector.

8. An apparatus, as set forth in claim 1, wherein the frequency of said second signal is within the radio frequency spectrum.

9. An apparatus for detecting linear position of a piston and a piston rod relative to a housing, said piston and piston rod being movable within said housing and defining a variable length coaxial resonant cavity, comprising: means for delivering a first signal having a preselected magnitude varying between preselected minimum and maximum values;
   means for receiving said first signal and delivering a second signal of a preselected frequency in response to the magnitude of said first signal;
   first coupling means for receiving said second signal and delivering an electromagnetically radiated signal into said coaxial cavity;
   second coupling means for receiving electromagnetic wave signals within said coaxial cavity and delivering a third signal in response to receiving said electromagnetic wave signals;
   detector means for receiving said third signal and delivering a fourth signal in response to the magnitude of said third signal attaining a peak value;
   means for resetting said first signal delivering means to said minimum value in response to receiving said fourth signal; and
   means for receiving said second signal, determining the frequency of said second signal, and determining the linear position of said piston and piston rod relative to said housing in response to the determined frequency of said received signal.

10. An apparatus, as set forth in claim 9, wherein said first coupling means includes processing means for receiving at least a portion of said second signal, determining the frequency of said received second signal in response to receiving said fourth signal, and determining the linear position of said piston and piston rod relative to said housing in response to the frequency of said second signal.

11. An apparatus, as set forth in claim 9, including means for holding the magnitude of said first signal at a preselected value in response to receiving said fourth signal.

12. An apparatus, as set forth in claim 9, wherein said fourth signal is delivered to said first signal delivering means after a preselected time delay.

13. An apparatus, as set forth in claim 10, wherein said processing means includes means for receiving at least a portion of said second signal and delivering a frequency divided signal;
   means for receiving said frequency divided signal, counting the number of cycles occurring within a preselected duration of time in response to receiving a control signal, and delivering a count signal having a magnitude responsive to the count; and
   microprocessor means for delivering a control signal to said counting means in response to receiving said fourth signal, receiving said count signal, determining the linear position of said piston and piston rod relative to said housing in response to the magnitude of said count signal.

14. An apparatus, as set forth in claim 9, wherein said first coupling means includes a loop antenna.

15. An apparatus, as set forth in claim 9, wherein said second coupling means includes a loop antenna and a radio frequency signal detector.

16. An apparatus, as set forth in claim 9, wherein the frequency of said second signal is within the radio frequency spectrum.

17. An apparatus for detecting linear position of a piston and a piston rod relative to a housing, said piston and piston rod being movable within said housing and defining a variable length coaxial resonant cavity, comprising:
   means for delivering a first signal having a preselected magnitude varying between preselected minimum and maximum values;
   means for receiving said first control signal and delivering a second signal of a preselected frequency in response to the magnitude of said first control signal;
   first coupling means for receiving said second signal and delivering an electromagnetically radiated signal into said coaxial cavity;
   second coupling means for receiving electomagnetic wave signals within said coaxial cavity and delivering a third signal in response to receiving said electromagnetic wave signals; and
   detector means for receiving said third signal and delivering a fourth signal in response to the magnitude of said third signal exceeding a preselected setpoint;
   means for holding the magnitude of said first signal at a preselected value in response to receiving said fourth signal;
   means for resetting said first control signal to said minimum value a preselected duration of time after receiving said fourth signal;

means for receiving at least a portion of said second signal and delivering a frequency divided signal;

means for receiving said frequency divided signal, counting the number of cycles occurring within a preselected duration of time in response to receiving a control signal, and delivering a count signal having a magnitude responsive to the count; and microprocessor means for delivering a control signal to said counting means in response to receiving said fourth signal, receiving said count signal, and determining the position of said piston and piston rod relative to said housing in response to the magnitude of said count signal.

18. An apparatus for detecting linear position of a piston and a piston rod relative to a housing, the piston and piston rod being movable within the housing and defining a variable length coaxial resonant cavity, comprising:

means for exciting a transverse electromagnetic wave within the coaxial cavity;

means for detecting the transverse electromagnetic wave and delivering a signal responsive to the frequency of the transverse electromagnetic wave; and means for receiving the signal and determining the linear position of the piston and piston rod relative to the housing in response to the transverse electromagnetic wave frequency.

19. An apparatus, as set forth in claim 18, wherein the means for exciting a transverse electromagnetic wave includes means for delivering a first signal having a preselected magnitude varying between preselected minimum and maximum values;

means for receiving the first signal and delivering a second signal of a preselected frequency in response to the magnitude of the first signal; and first coupling means for receiving the second signal and delivering an electromagnetically radiated signal into the coaxial cavity.

20. An apparatus, as set forth in claim 19, wherein the means for detecting the transverse electromagnetic wave includes a second coupling means for receiving the transverse electromagnetic wave signals within the coaxial cavity and delivering a third signal having a magnitude responsive to the transverse electromagnetic wave energy; and detector means for receiving the third signal and delivering a fourth signal in response to the magnitude of the third signal exceeding a preselected setpoint.

21. An apparatus, as set forth in claim 19 wherein the first coupling means includes processing means for receiving at least a portion of said second signal, determining the frequency of said received second signal in response to receiving said fourth signal, and determining the linear position of said piston in response to the frequency of said second signal.

22. An apparatus, as set forth in claim 20, including means for holding the magnitude of said first signal at a preselected value in response to receiving said fourth signal.

23. An apparatus, as set forth in claim 20, including means for resetting the first signal delivering means to the minimum value in resposne to receiving the fourth signal.

24. An apparatus, as set forth in claim 23, wherein said fourth signal is delivered to said first signal delivering means after a preselected time delay.

25. An apparatus, as set forth in claim 21, wherein said processing means includes means for receiving at least a portion of said second signal and delivering a frequency divided signal;

means for receiving said frequency divided signal, counting the number of cycles occurring within a preselected duration of time in response to receiving a control signal, and delivering a count signal having a magnitude responsive to the count; and microprocessor means for delivering a control signal to said counting means in response to receiving said fourth signal, receiving said count signal, determining the linear position of said piston and piston rod relative to said housing in response to the magnitude of said count signal.

26. An apparatus, as set forth in claim 19, wherein said first coupling means includes a loop antenna.

27. An apparatus, as set forth in claim 20, wherein said second coupling means includes a loop antenna and a radio frequency signal detector.

28. An apparatus, as set forth in claim 19, wherein the frequency of said second signal is within the radio frequency spectrum.

* * * * *